United States Patent [19]

Shimamune

[11] Patent Number: 4,802,138
[45] Date of Patent: Jan. 31, 1989

[54] SENSE AMPLIFIER CIRCUIT FOR SEMICONDUCTOR MEMORY

[75] Inventor: Yuji Shimamune, Kawasaki, Japan

[73] Assignee: Kabushiki Kaisha Toshiba, Kawasaki, Japan

[21] Appl. No.: 10,443

[22] Filed: Feb. 3, 1987

[30] Foreign Application Priority Data

Feb. 24, 1986 [JP] Japan .................................. 61-38796

[51] Int. Cl.$^4$ ............................................. G11C 11/40
[52] U.S. Cl. .................................... 365/210; 365/208; 307/530
[58] Field of Search ............... 365/203, 205, 207, 208, 365/210; 307/530, 355

[56] References Cited

U.S. PATENT DOCUMENTS 4,434,479 2/1984 Chen et al. ........................ 365/210

OTHER PUBLICATIONS

Tanaka et al., "A Programmable 256K CMOS EPROM with On-Chip Test Circuits", IEEE International Solid-State Circuits Conference, ISSCC Digest of Technical Papers, pp. 148–149, Feb. 23, 1984.

Primary Examiner—Joseph A. Popek
Attorney, Agent, or Firm—Finnegan, Henderson, Farabow, Garrett, & Dunner

[57] ABSTRACT

A sense amplifier circuit comprises a first amplifier circuit for detecting the data from a memory cell and generating an output signal in accordance with the detected data, a first load MOS transistor of one conductivity type connected between an output terminal of the first amplifier circuit and a power source terminal, a second amplifier circuit for detecting the data from a dummy cell and generating an output signal in accordance with the detected data, a second load MOS transistor of one conductivity type and a third load MOS transistor, which are connected in parallel between an output terminal of the second amplifier circuit and the power source terminal, and a comparator for comparing the output signals from the first and second amplifier circuits and generating an output signal in accordance with the result of the comparison. The third load MOS transistor is a MOS transistor of an opposite conductivity type whose back gate is connected to a reference potential terminal.

13 Claims, 3 Drawing Sheets

SENSE AMPLIFIER CIRCUIT FOR SEMICONDUCTOR MEMORY

BACKGROUND OF THE INVENTION

The present invention relates to a sense amplifier circuit which is used in an electrically programmable nonvolatile semiconductor memory or the like and, more particularly, to a sense amplifier circuit for comparing a bit line potential on the memory cell side and a reference potential on the dummy cell side.

An electrically programmable nonvolatile memory, for example, an electrically programmable read only memory (EPROM) of the ultraviolet erasing type, is constituted so as to have a memory cell array 1 and a sense amplifier 3, as shown in FIG. 1. In memory cell array 1, memory cells MC of, e.g., the floating gate type, are arranged in a matrix form, and word lines $WL_1$ to $WL_M$ and bit lines $BL_1$ to $BL_N$ are selectively coupled to those memory cells. One end of each of N-channel MOS transistors $QB_1$ to $QB_N$ for selecting the bit lines is commonly connected to a node NB. Bit lines $BL_1$ to $BL_N$ are respectively connected to the other ends of MOS transistors $QB_1$ to $QB_N$. MOS transistors $QB_1$ to $QB_N$ are connected such that their conduction states are controlled by an output of a column decoder (not shown). Node NB is connected to an input terminal of a bit line potential amplifier circuit 2 whose output terminal is connected to an input node $N_1$ of a differential amplifier type comparator 3 such as a P-channel current mirror type comparator. Amplifier circuit 2 includes an enhancement type N-channel MOS transistor $Q_1$ connected between bit line node NB and a power source terminal VC; an enhancement type N-channel MOS transistor $Q_2$ whose one end is connected to bit line node NB; and an enhancement type P-channel MOS transistor $Q_3$ whose gate and drain are connected to the other end of MOS transistor $Q_2$ and whose source is connected to power source terminal VC. A predetermined bias voltage VBA is applied from a bias voltage generator 4 to the gates of MOS transistors $Q_1$ and $Q_2$ through a bias line BSL. Bias voltage generator 4 comprises: a P-channel MOS transistor $Q_4$ which is connected between power source terminal VC and bias line BSL and whose gate is grounded; an N-channel MOS transistor $Q_5$ whose gate and drain are connected to bias line BSL; and an N-channel MOS transistor $Q_6$ whose gate and drain are connected to the source of MOS transistor $Q_5$ and whose source is grounded.

Each of memory cells MC in memory cell array 1 is selectively set either to the state in which data was written, i.e., the state ("0" state) in which a threshold voltage $V_{TH}$ is high, or the erasing state in which no data is written, i.e., the state ("1" state) in which threshold voltage $V_{TH}$ is low. Therefore, in the reading mode, the data read out of the selected memory cell is amplified to bit line potential VB by bit line potential amplifier circuit 2 and, thereafter, it is supplied to one input terminal $N_1$ of comparator 3. In this case, it is assumed that when the data read out of the memory cell in the "0" or "1" state is amplified by amplifier circuit 2, it is converted into bit line potential $VB_0$ and $VB_1$, respectively.

A MOS transistor $Q_7$ for controlling the writing operation whose conduction state is controlled in accordance with inverted data $\overline{D_{in}}$ of write data $D_{in}$ is connected between bit line node NB and a high voltage terminal VP to which a writing voltage is applied. Therefore, it is possible, when writing data into the selected memory cell, to apply a high voltage VP to the drain of the selected memory cell in which a high voltage is also applied to the control gate.

Comparator 3 is the current mirror circuit comprising two N-channel MOS transistors $Q_8$ and $Q_9$ for amplification and two P-channel MOS transistors $Q_{10}$ and $Q_{11}$ serving as loads.

A reference voltage generator 5 is used to apply a reference voltage $V_{ref}$ to the other input terminal $N_2$ of comparator 3 and has a bit line potential amplifier circuit 6 which is constituted in a manner almost similar to bit line potential amplifier circuit 2. Amplifier circuit 6 includes: MOS transistors $Q_{1A}$ through $Q_{3A}$ which are constituted and connected in a manner similar to MOS transistors $Q_1$ through $Q_3$ in amplifier circuit 2; and a MOS transistor $Q_{12}$ connected between power source terminal VC and input terminal $N_2$. Reference potential generator 5 further has a floating gate type dummy cell DC in which one end is grounded and the other end is connected to amplifier circuit 6 through a bit line BLD and an N-channel MOS transistor QBD. Dummy cell DC is set into the erasing state ("1" state) and power source voltage VC is applied to the control gates of dummy cell DC and MOS transistor QBD.

Reference potential $V_{ref}$, which is generated from reference potential generator 5, must be set to satisfy the relation of $VB_0 > V_{ref} > VB_1$, i.e., so that $V_{ref}$ is lower than potential $VB_0$ at which the bit line is set when the data is read out of the memory cell in the "0" state and so that $V_{ref}$ is higher than potential $VB_1$ at which the bit line is set when the data is read out of the memory cell in the "1" state. For this reason, comparator 3 can certainly generate the output signal corresponding to the data read out of the selected memory cell. Thus, conventionally, MOS transistor $Q_{12}$ is connected in parallel with MOS transistor $Q_{3A}$, which is the same size as MOS transistor $Q_3$, as the resistance load of the bit line in reference potential generator 5. Consequently, the synthesized ON reference of MOS transistors $Q_{3A}$ and $Q_{12}$ is smaller than the ON resistance of MOS transistor $Q_3$ and the relation of $V_{ref} > VB_1$ is derived. In this manner, reference potential $V_{ref}$ is set to a value between potentials $VB_0$ and $VB_1$ for a standard power source voltage VCS of, e.g., 5 V.

As shown in FIG. 2, reference potential $V_{ref}$ and bit line potentials $VB_0$ and $VB_1$ vary in accordance with a change in power source voltage VC. As will be obvious from FIG. 2, reference potential $V_{ref}$ changes at an increase rate larger than that of bit line potential $VB_0$ in association with an increase in power source voltage VC. When power source voltage VC rises to a $VC_1$ level of, e.g., 6 V, reference potential $V_{ref}$ becomes almost equal to bit line potential $VB_0$. When power source voltage VC further increases, $V_{ref}$ becomes larger than $VB_0$, causing a malfunction of the sense amplifier circuit.

The difference of dependency on power source voltage VC between bit line potential $VB_0$ and reference potential $V_{ref}$ is caused by the difference between the size of load MOS transistor $Q_3$ in amplifier circuit 2 and the total size of load MOS transistors $Q_{3A}$ and $Q_{12}$ in reference potential generator 5.

In the sense amplifier circuit shown in FIG. 1, the allowable range between a standard power source voltage VCS and the maximum allowable power source voltage $VC_1$, namely, the power source voltage margin, cannot be set to a sufficiently large value. Therefore, not only is a malfunction of comparator 3 likely to occur due to a variation in power source voltage VC, but there is also a possibility of causing a malfunction of comparator 3 by other factors, for example, by variations in circuit element parameters and in writing voltage into the memory cell as well. For example, even if reference potential generator 5 is designed to generate proper reference potential $V_{ref}$ when it is driven by standard power source voltage VCS (=5 V), there is a case where the sense amplifier circuit in the memory IC actually manufactured cannot normally operate at a power source voltage VC =5 V because of a variation in element parameters due to a fluctuation in manufacturing processes.

SUMMARY OF THE INVENTION

It is an object of the present invention to provide a sense amplifier circuit which can always correctly operate without being largely influenced by a fluctuation in power source voltage.

This object is accomplished by a sense amplifier circuit comprising: a first amplifier circuit for detecting data from a memory cell and generating an output signal in accordance with the detected data; a MOS transistor of one conductivity type connected between an output terminal of the first amplifier circuit and a power source terminal; a second amplifier circuit for detecting data from a dummy cell and generating an output signal in accordance with the detected data; a MOS transistor of one conductivity type and a MOS transistor of an opposite conductivity type which are conected in parallel between an output terminal of the second amplifier circuit and the power source terminal, a back gate of the MOS transistor of the opposite conductivity type being connected to a reference potential terminal; and a comparator for comparing the output signals of the first and second amplifier circuits and generating an output signal in accordance with the result of the comparison.

In this invention, since the back gate of the MOS transistor of the opposite conductivity type is connected to the reference potential terminal, when the power source voltage rises, the ON resistance of the MOS transistor of the opposite conductivity type rises. Thus, the rate of the output signal of the second amplifier circuit which increases with an increase in power source voltage is reduced.

DETAIILED DESCRIPTION OF THE PREFERRED EMBODIMENT

Figure 1:
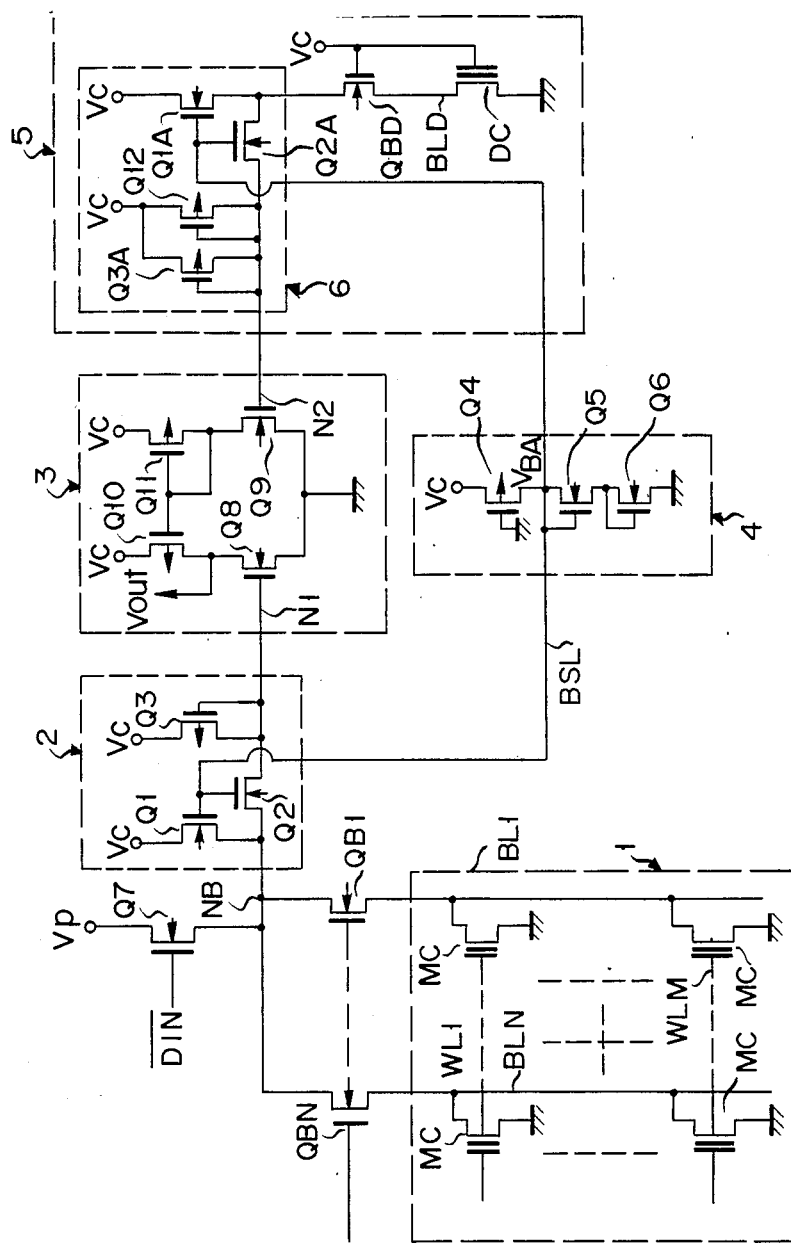
FIG. 1 is a circuit diagram of a memory circuit including a conventional sense amplifier circuit.
Figure 2:
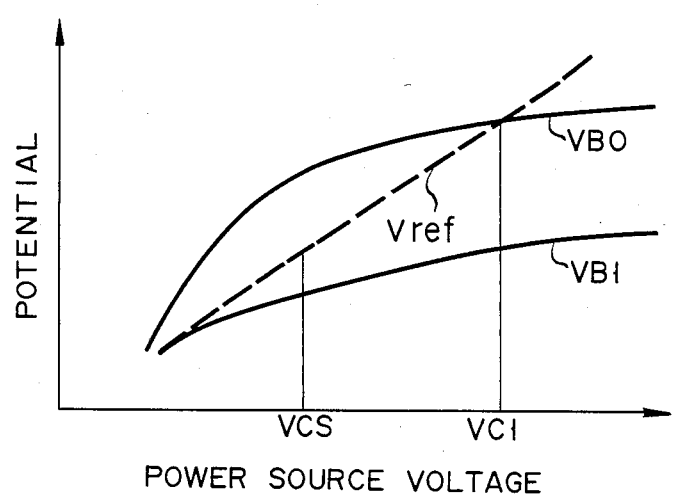
FIG. 2 shows the relation between a power source voltage and each of a reference potential and a bit line potential in accordance with the data read out of the selected memory cell in the memory circuit shown in FIG. 1.
Figure 3:
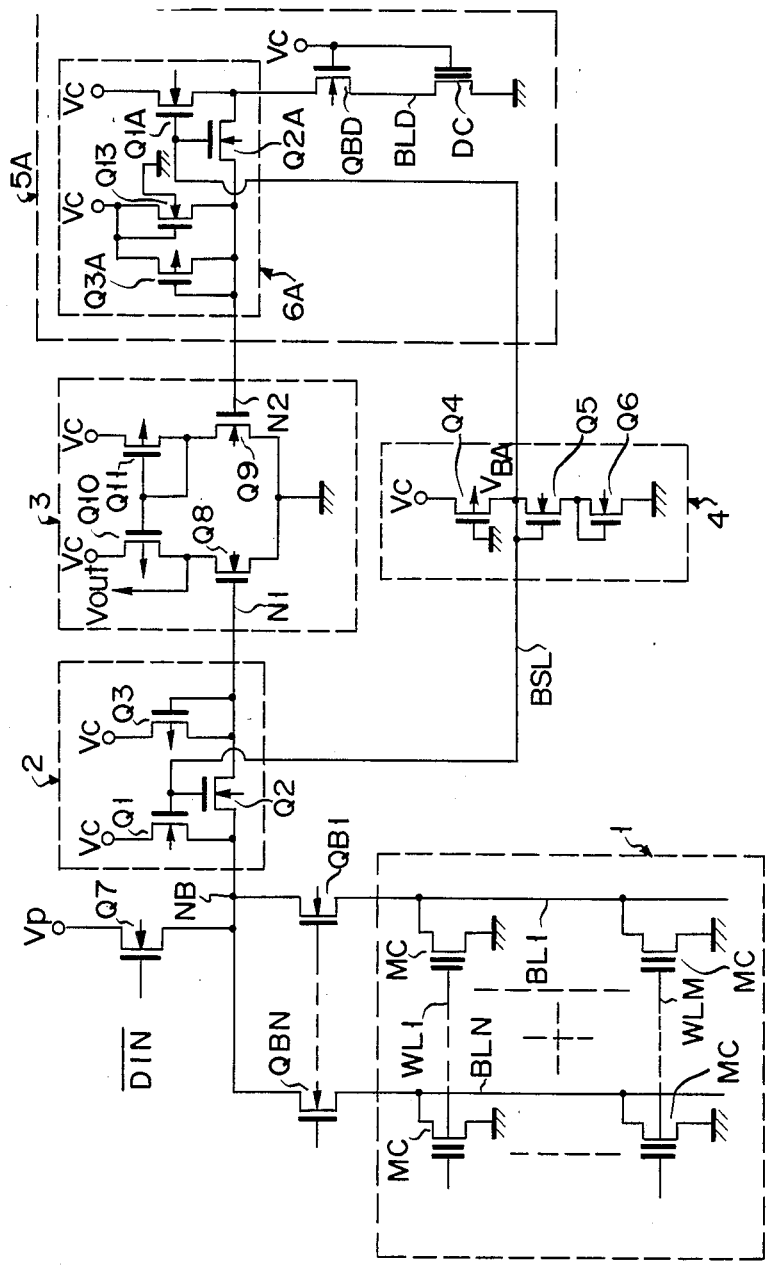
FIG. 3 is a circuit diagram of a memory circuit including a sense amplifier circuit according to an embodiment of the present invention.

FIG. 3 shows an EPROM including a sense amplifier circuit according to an embodiment of the present invention. The sense amplifier circuit is constituted so that a bit line potential amplifier circuit 6A in a reference potential generator 5A has an N-channel MOS transistor $Q_{13}$ whose substrate or back gate is grounded and whose drain and gate are connected to power source terminal VC (and not to MOS transistor $Q_{12}$ as shown in FIG. 1). In the circuit shown in FIG. 3, the parts and components that are the same as those in the circuit shown in FIG. 1 are designated by the same reference numerals and their descriptions are omitted.

In FIG. 3, the size and parameters of an N-channel MOS transistor $Q_{13}$ are set such that when power source voltage VC has standard value VCS, reference potential $V_{ref}$ is set to an intermediate potential between bit line potentials $VB_0$ and $VB_1$. In this manner, in this embodiment, the synthesized ON resistance of MOS transistors $Q_{3A}$ and $Q_{13}$ in bit line potential amplifier circuit 6A is set to a value smaller than the ON resistance of MOS transistor $Q_3$ in bit line potential amplifier circuit 2. Therefore, in the reading mode, for example, when the data is read out of the memory cell in the "0" state, bit line potential $VB_0$, which is applied to input terminal $N_1$ of comparator 3, is higher than the bit line potential which is read out of dummy cell DC and is amplified by bit line amplifier circuit 6A. Thus, comparator 3 generates the output data in accordance with the data in the selected memory cell.

Figure 4:
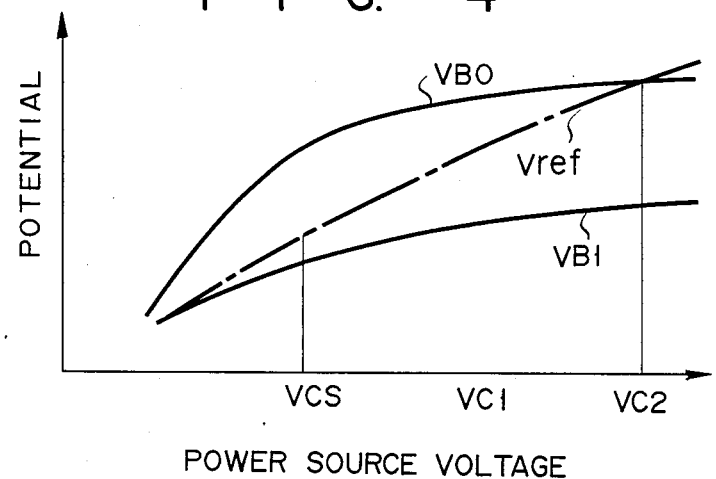
FIG. 4 shows the relation between a power source voltage and each of a reference potential and a bit line potential in accordance with the data read out of the selected memory cell in the memory circuit shown in FIG. 3.

In the sense amplifier circuit shown in FIG. 3, when power source voltage VC becomes higher than standard power source voltage VCS, the ON resistance of MOS transistor $Q_{13}$ increases due to the back gate bias effect, thereby suppressing an increase in reference potential $V_{ref}$. Namely, the dependency of reference potential $V_{ref}$ on power source voltage VC decreases. For an increase in power source voltage VC, reference potential $V_{ref}$ rises more slowly, as compared with the reference potential in the sense amplifier circuit shown in FIG. 1. Therefore, as shown in FIG. 4, if power source voltage VC is lower than $VC_2$ level, which is higher than the $VC_1$ level, the relation of $VB_0 > V_{ref}$ is satisfied. The maximum permissible voltage $VC_2$ is set to a value within a range of, e.g., 6.5 to 7 V. Consequently, the power source voltage margin is enlarged and a high operation margin is secured for a variation in power source voltage, variations in element parameters due to the fluctuation in manufacturing processes, variations in writing conditions such as time and voltage required for writing data into the nonvolatile memory cell, and the like. The performance and yield of the memory products can be improved.

Although the invention has been described above with respect to an embodiment, the invention is not limited to only this embodiment. For example, although the sense amplifier circuit has been shown in an EPROM in FIG. 3, the sense amplifier circuit according to the invention can be also used in an electrically erasable programmable nonvolatile memory (EEPROM).

What is claimed is:

1. A sense amplifier circuit comprising:
   first amplifier means for detecting data from a memory cell and generating an output signal in accordance with the detected data;

a first load MOS transistor of one conductivity type connected between an output terminal of said first amplifier means and a power source terminal;

second amplifier means for detecting data from a dummy cell and generating an output signal in accordance with the detected data;

a second load MOS transistor of one conductivity type and a third load MOS transistor which is an enhancement type N-channel MOS transistor whose gate and drain are connected to said power source terminal, said second load MOS transistor and said third load MOS transistor being connected in parallel between an output terminal of said second amplifier means and said power source terminal, a back gate of said third load MOS transistor being connected to a reference potential terminal;

comparing means for comparing the output signals from said first and second amplifier means and generating an output signal in accordance with the result of the comparison;

bias voltage generating means for generating a bias output voltage, wherein said first amplifier means has a first N-channel MOS transistor with first and second ends, said first end being connected to said comparing means, and a second N-channel MOS transistor connected between the second end of said first N-channel MOS transistor and said power source terminal;

wherein said second amplifier means has a third N-channel MOS transistor with first and second ends, said first end being connected to said comparing means, and a fourth N-channel MOS transistor connected between the second end of said third N-channel MOS transistor and said power source terminal; and wherein said output voltage of said bias voltage generating means is applied to gates of said first to fourth N-channel MOS transistors.

2. A sense amplifier circuit according to claim 1 wherein said comparing means is a differential amplifying type comparator which responds to the output signals from said first and second amplifier means.

3. A sense amplifier circuit comprising:

first amplifier means for detecting data from a memory cell and generating an output signal in accordance with the detected data;

a first load MOS transistor of one conductivity type connected between an output terminal of said first amplifier means and a power source terminal;

second amplifier means for detecting data from a dummy cell and generating an output signal in accordance with the detected data;

a second load MOS transistor of one conductivity type and a third load MOS transistor which is an enhancement type N-channel MOS transistor whose gate and drain are connected to said power source terminal, said second load MOS transistor and said third load MOS transistor being connected in parallel between an output terminal of said second amplifer means and said power source terminal, and a back gate of said third load MOS transistor being connected to a reference potential terminal; and comparing means for comparing the output signals from said first and second amplifier means and generating an output signal in accordance with the result of the comparison.

4. A sense amplifier circuit according to claim 3, wherein said first load MOS transistor is an enhancement type P-channel MOS transistor whose gate and drain are connected to the output terminal of said first amplifier means, and said second load MOS transistor is an enhancement type P-channel MOS transistor whose gate and drain are connected to the output terminal of said second amplifier means and which has substantially the same size as that of said first load MOS transistor.

5. A sense amplifier circuit according to claim 4, further comprising bias voltage generating means for generating a bias output voltage, and wherein said first amplifier means has a first N-channel MOS transistor with first and second ends, the first end being connected to said comparing means, and a second N-channel MOS transistor connected between the second end of said first N-channel MOS transistor and said power source terminal, wherein said second amplifier means has a third N-channel MOS transistor having first and second ends, said first end being connected to said comparing means, and a fourth N-channel MOS transistor connected between the second end of said third N-channel MOS transistor and said power source terminal, and, wherein said bias output voltage of said bias voltage generating means is applied to gates of said first to fourth N-channel MOS transistors.

6. A sense amplifier circuit according to claim 5, wherein said comparing means is a differential amplifying type comparator which responds to the output signals from said first and second amplifier means.

7. A sense amplifier circuit according to claim 6, wherein said comparator is a current mirror type comparator.

8. A sense amplifier circuit comprising:

first amplifier means for detecting data from a memory cell and generating an output signal in accordance with the detected data;

a first load MOS transistor of one conductivity type connected betewen an output terminal of said first amplifier means and a power source terminal;

second amplifier means for detecting data from a dummy cell and generating an output signal in accordance with the detected data;

a second load MOS transistor of one conductivity type and a third load MOS transistor of an opposite conductivity type which are connected in parallel between an output terminal of said second amplifier means and said power source terminal, a back gate of said third load MOS transistor being connected to a reference potential terminal; and comparing means for comparing the output signals from said first and second amplifier means and generating an output signal in accordance with the result of the comparison.

9. A sense amplifier circuit according to claim 8, further comprising bias voltage generating means for generating a bias output voltage, and wherein said first amplifier means has a first N-channel MOS transistor with first and second ends, said first end is connected to said comparing means, and a second N-channel MOS transistor connected between the second end of said first N-channel MOS transistor and said power source terminal, wherein said second amplifier means has
- a third N-channel MOS transistor with first and second ends, said first end being connected to said comparing means, and
- a fourth N-channel MOS transistor connected between the second end of said third N-channel MOS transistor and said power source terminal, and wherein said output voltage of said bias voltage generating means is applied to gates of said first to fourth N-channel MOS transistors.

10. A sense amplifier circuit according to claim 9, wherein said comparing means is a differential amplifying type comparator which responds to the output signals from said first and second amplifier means.

11. A sense amplifier circuit according to claim 8, wherein said first load MOS transistor is an enhancement type P-channel MOS transistor whose gate and drain are connected to the output terminal of said first amplifier means, and said second load MOS transistor is an enhancement type P-channel MOS transistor whose gate and drain are connected to the output terminal of said second amplifier means and which has substantially the same size as that of said first load MOS transistor.

12. A sense amplifier circuit according to claim 11, further comprising bias voltage generating means for generating a bias output voltage, and wherein said first amplifier means has
- a first N-channel MOS transistor with first and second ends, said first end being connected to said comparing means, and
- a second N-channel MOS transistor connected between the second end of said first N-channel MOS transistor and said power source terminal, wherein said second amplifier means has
- a third N-channel MOS transistor with first and second ends, said first end being connected to said comparing means, and
- a fourth N-channel MOS transistor connected between the second end of said third N-channel MOS transistor and said power source terminal, and wherein said output voltage of said bias voltage generating means is applied to gates of said first to fourth N-channel MOS transistors.

13. A sense amplifier circuit according to claim 12, wherein said comparing means is a differential amplifying type comparator which responds to the output signals from said first and second amplifier means.

* * * * *